(12) United States Patent
Ku et al.

(10) Patent No.: US 7,117,932 B2
(45) Date of Patent: Oct. 10, 2006

(54) RADIATOR INCLUDING A HEAT SINK AND A FAN

(75) Inventors: Chin-Long Ku, Tu-Cheng (TW); Po-Han Chan, Tu-Cheng (TW)

(73) Assignee: Hon Hai Precision Industry Co., Ltd., (TW)

( * ) Notice: Subject to any disclaimer, the term of this patent is extended or adjusted under 35 U.S.C. 154(b) by 0 days.

(21) Appl. No.: 10/892,041

(22) Filed: Jul. 15, 2004

(65) Prior Publication Data

US 2005/0056399 A1 Mar. 17, 2005

(30) Foreign Application Priority Data

Sep. 17, 2003 (TW) .............................. 92216666 U

(51) Int. Cl.
*H05K 7/20* (2006.01)

(52) U.S. Cl. ....................... 165/121; 165/80.3; 361/697

(58) Field of Classification Search ..................... None
See application file for complete search history.

(56) References Cited

U.S. PATENT DOCUMENTS

| | | | | |
|---|---|---|---|---|
| 6,017,185 A | | 1/2000 | Kuo ........................... 415/177 |
| 6,053,242 A | * | 4/2000 | Hsieh .......................... 165/121 |
| 6,196,302 B1 | * | 3/2001 | Chuang ....................... 165/122 |
| 6,206,635 B1 | * | 3/2001 | Golm et al. ............. 415/209.1 |
| 6,330,908 B1 | | 12/2001 | Lee et al. .................... 165/185 |
| 6,398,492 B1 | * | 6/2002 | Cho et al. .................... 415/191 |
| 6,404,634 B1 | * | 6/2002 | Mann .......................... 361/704 |
| 6,427,763 B1 | * | 8/2002 | Matsumoto ................ 165/80.3 |
| 6,449,151 B1 | | 9/2002 | Chen ........................... 361/697 |
| 6,520,250 B1 | * | 2/2003 | Lee et al. .................... 165/121 |
| 6,547,540 B1 | * | 4/2003 | Horng et al. .......... 417/423.14 |
| 6,561,762 B1 | * | 5/2003 | Horng et al. ............. 415/211.2 |
| 6,640,882 B1 | * | 11/2003 | Dowdy et al. .............. 165/80.3 |
| 6,650,541 B1 | * | 11/2003 | Simon et al. ................ 361/697 |
| 6,654,246 B1 | | 11/2003 | Wu .............................. 361/697 |
| 6,671,172 B1 | * | 12/2003 | Carter et al. ................ 361/697 |
| 6,899,521 B1 | * | 5/2005 | Horng et al. ............. 415/208.2 |
| 6,910,862 B1 | * | 6/2005 | Horng et al. ............. 415/211.2 |
| 2003/0102110 A1 | * | 6/2003 | Wagner ....................... 165/80.3 |
| 2005/0061478 A1 | * | 3/2005 | Huang ........................ 165/80.3 |

* cited by examiner

*Primary Examiner*—Allen J. Flanigan
(74) *Attorney, Agent, or Firm*—Morris Manning & Martin LLP; Tim Tingkang Xia, Esq.

(57) ABSTRACT

A radiator includes a heat sink (10), a fan holder (50) and a fan (30). The heat sink includes a heat-absorbing member (12, 18) that defines a cavity (20) in an end thereof. The fan holder includes a central hub (52) secured into the cavity of the heat sink. The fan is positioned to the heat sink via the fan holder.

18 Claims, 2 Drawing Sheets

RADIATOR INCLUDING A HEAT SINK AND A FAN

BACKGROUND OF THE INVENTION

1. Field of the Invention

The present invention relates to radiators for removing heat from electronic components, and more particularly to a radiator including a heat sink and a fan mounted on the heat sink for enforcing air convection.

2. Description of Related Art

During operating of an electronic component such as a computer central processing unit (CPU), a large amount of heat is often produced. The heat must be quickly removed from the CPU to prevent it from becoming unstable or being damaged.

Typically, a heat sink is attached to an outer surface of the CPU to facilitate removal of heat therefrom. A fan is mounted on top of the heat sink to enhance heat dissipation efficiency.

U.S. Pat. No. 6,017,185 disclosed a radiator in which the fan is mounted to the heat sink via four screws. Correspondingly, four screw holes are defined in a base of the heat sink. The screw holes should be evenly distributed on the base and each has a coordinated position according to locations of the others in order to stably fix the fan to the heat sink. As a result, manufacture cost of the radiator is increased. Furthermore, once any one of the screws for mounting the fan to the heat sink is damaged, the fan is at the risk of falling due to unexpected shaking or vibration. This adversely affects the heat dissipation efficiency of the radiator. Additionally, it takes a long term to install four screws into the screw holes, especially in mass production.

SUMMARY OF THE INVENTION

Accordingly, an object of the present invention is to provide a radiator which has a stable configuration.

Another object of the present invention is to provide a radiator which has a decrease in manufacture cost and an increase in production of the radiator.

In order to achieve the objects set out above, a radiator in accordance with a preferred embodiment of the present invention comprises a heat sink, a fan holder and a fan. The heat sink comprises a heat-absorbing member that defines a cavity at one side thereof. The fan holder comprises a central hub secured into the cavity of the heat sink. The fan is positioned to the heat sink via the fan holder.

Other objects, advantages and novel features of the present invention will become more apparent from the following detailed description when taken in conjunction with the accompanying drawings, in which:

DETAILED DESCRIPTION OF THE INVENTION

Figure 1:
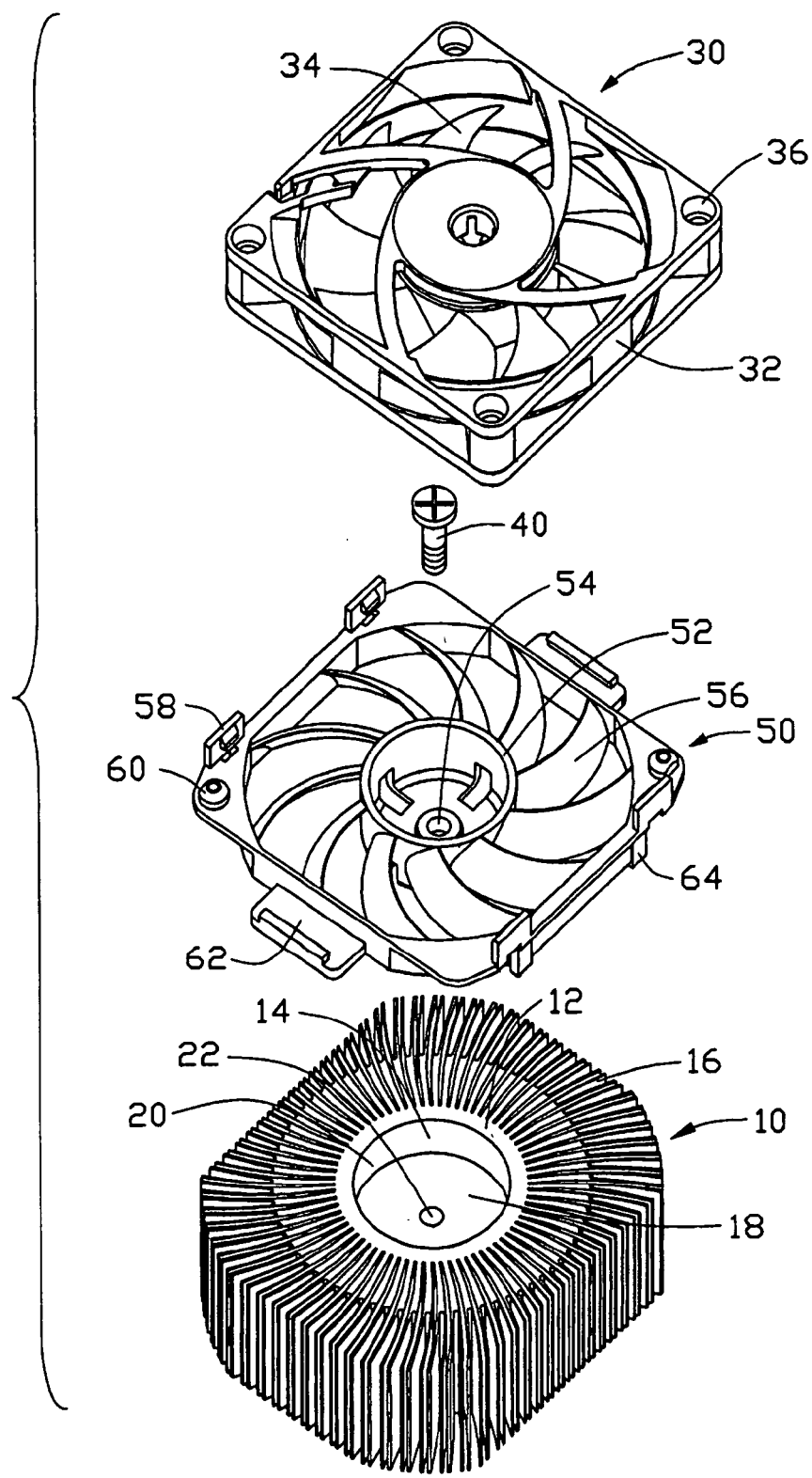
FIG. 1 is an exploded, isometric view of a radiator in accordance with the preferred embodiment of the present invention.
Figure 2:
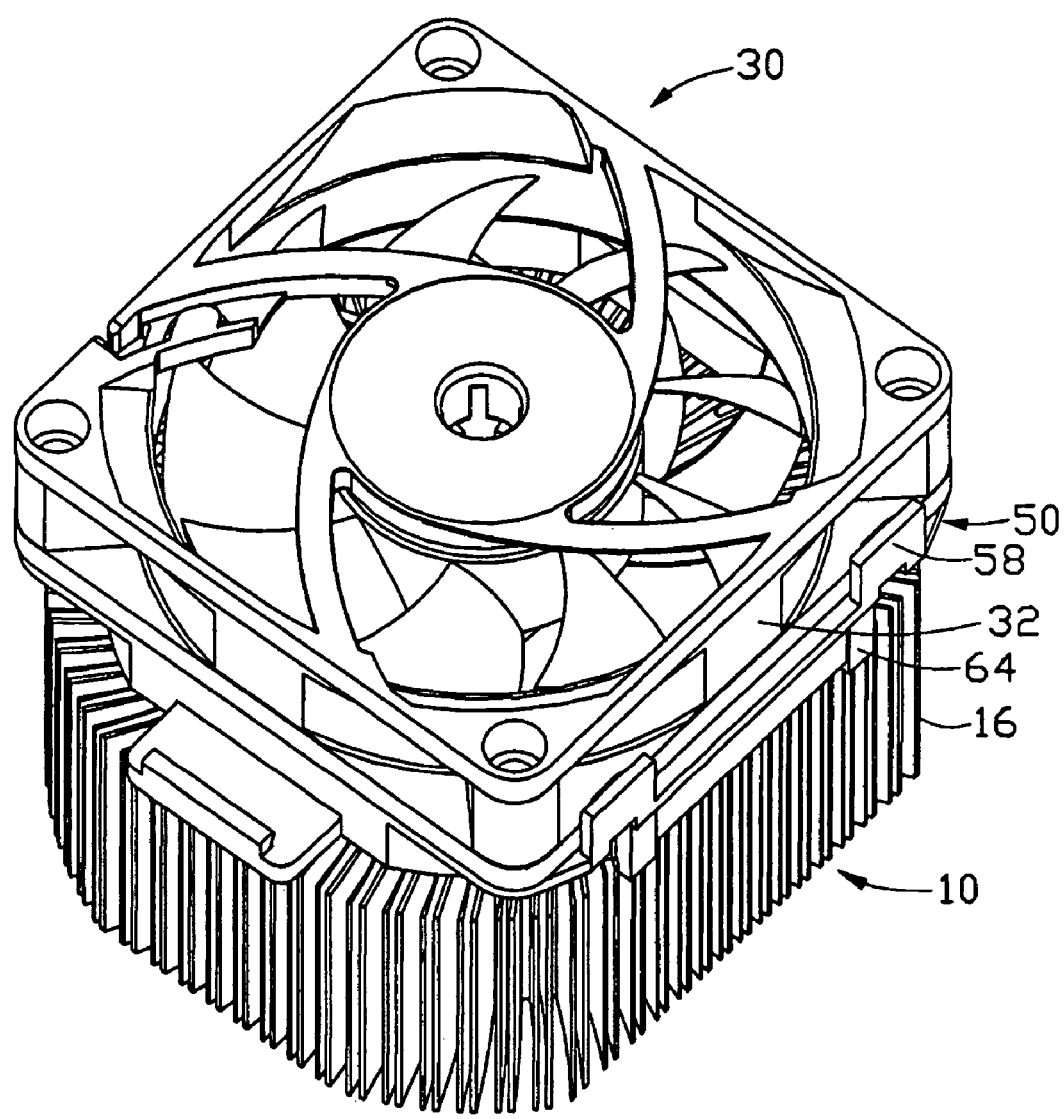
FIG. 2 is an assembled view of FIG. 1.

Referring to FIG. 1, a radiator in accordance with the preferred embodiment of the present invention is provided to remove heat from an electronic component (not shown), such as a central processing unit (CPU). The radiator comprises a heat sink 10, a fan 30 and a fan holder 50 for attaching the fan 30 to the heat sink 10.

The heat sink 10 comprises a cylindrical column 12 and a plurality of radial fins 16 radially extending from the circumference of the column 12. An axial channel 14 is defined in the column 12. The channel 14 interferentially receives a heat-conductive pillar 18 therein and therefore remains a cavity 20 right above the pillar 18. A hole 22, especially preferably to be a screw hole, is defined in a substantially central portion of an end of the pillar 18 in communication with the cavity 20. An opposite end of the pillar 18 is attachable to an electronic component (not shown), such as a chip, a central processing unit (CPU) or the like.

The fan 30 comprises a rectangular frame 32 and a plurality of rotor blades 34 radially arranged in the frame 32 in a manner that each rotor blade 34 stretches clockwise. Four locating holes 36 are defined at four corners of the rectangular frame 32, respectively.

The holder 50 has a rectangular shape in the preferred embodiment but is not limited to that shape. A hub 52 is formed in a substantial middle of the holder 50 and extends partially toward the heat sink 10 corresponding to the cavity 20. A bore 54 is defined in a middle of the hub 52, corresponding to the hole 22. A plurality of stator blades 56 is radially formed at an outer periphery of the hub 52. Each of the stator blades 56 has a shape similar to that of every rotor blade 34 and is configured in a manner that each stator blade 56 stretches counterclockwise. Pairs of spaced catches 58 are symmetrically formed at a main side of the holder 50 for jointly embracing the fan 30 therebetween. A pair of shoulders 62 is symmetrically formed at two opposite sides of the holder 50 for supporting a corresponding pair of clips (not shown). A pair of pins 60 is further formed at two diagonal corners of the holder 50 corresponding to the locating holes 36 of the fan 30. Pairs of spaced latches 64 are symmetrically formed at the other two opposite sides of the holder 50 for engaging with the heat sink 10.

In assembly of the radiator, the holder 50 is placed to the heat sink 10 having the hub 52 received into the cavity 20. A screw 40, or its equivalents such as a rivet or a pin or the like, is inserted through the bore 54 of the holder 50 and further engaged in the hole 22 of the heat sink 10 so that the holder 50 is secured to the heat sink 10. The latches 64 abut against corresponding fins 16 for facilitating the positioning of the holder 50 to the heat sink 10. The fan 30 is pressed onto the holder 50 so that the catches 58 jointly embrace the fan 30 therebetween. The pins 60 are received into the corresponding locating holes 36 for keeping the fan 30 in place. In use, the stator blades 56 lead airflow from the fan 30 into the heat sink 10 in order to diminish the airflow speed along any radial direction and prevent the airflow from earlier escape out of the radiator.

It is to be understood, however, that even though numerous characteristics and advantages of the present invention have been set forth in the foregoing description, together with details of the structure and function of the invention, the disclosure is illustrative only, and changes may be made, for example, the pins 60 inserting into the locating holes 36 of the fan 30 can further form a hook at their distal ends to clasp in the holes 36 for positioning the fan 30 to the holder 50, or, a pin can be formed from the heat-conductive pillar 18 and engaged in the bore 54 of the holder 50 so that the holder 50 is mounted to the heat sink 10.

What is claimed is:

1. A radiator comprising:
a heat sink having a heat-absorbing member;
a fan holder having a central portion thereof secured to the heat-absorbing member so that the fan holder is mounted to the heat sink; and
a fan positioned to the heat sink via the fan holder;
wherein the fan holder comprises a hub defining a central bore therein, a plurality of locating members formed at the fan holder for locating the fan to the fan holder, the locating members comprising a plurality of catches embracing the fan therebetween and a plurality of pins inserted within the fan, and an insert in physical connection with the heat-absorbing member is extended through the bore in order to secure the fan holder to the heat sink.

2. The radiator of claim 1, wherein a plurality of fins are radially arranged at a periphery of the heat-absorbing member.

3. The radiator of claim 1, wherein a cavity is defined in the heat-absorbing member, the cavity receiving the hub therein.

4. The radiator of claim 1, wherein the insert is a screw that is inserted through the bare and screwly engaged in the heat-absorbing member.

5. The radiator of claim 1, wherein the fan holder comprises at least a pair of latches for facilitating engagement of the fan holder to the heat sink.

6. The radiator of claim 1, wherein a plurality of stator blades is formed on the fan holder spread in a direction opposing to rotor blades of the fan, for guiding airflow from the fan into the heat sink.

7. A radiator comprising:
a heat sink comprising a heat-absorbing member which defines a cavity in an end thereof, the heat-absorbing member comprising a column defining an axial channel therein, and a pillar interferentially inserted into the channel;
a fan holder comprising a central hub secured to the heat sink in the cavity; and
a fan positioned to the heat sink via the fan holder;
wherein the fan holder further comprises a plurality of stator blades formed at a periphery of the hub for guiding airflow from the fan into the heat sink.

8. The radiator of claim 7, wherein a hole is defined in the heat-absorbing member and a bore is defined in the hub corresponding to the hole for insertion of an insert.

9. The radiator of claim 8, wherein the insert is a screw, the hole is a screw hole and the bore is a through hole.

10. The radiator of claim 7, wherein a plurality of fins is radially arranged at a periphery of the heat-absorbing member.

11. The radiator of claim 7, wherein the channel is longer than the pillar so that the cavity is defined.

12. A radiator comprising:
a heat sink comprising a first side for contacting a heat source, and an opposite second side;
a fan assembly comprising a mounting side mourned on the second side of the heat sink; and
mounting arrangements fanned on the mounting side of the fan assembly and in the second side of the heat sink to secure the fan assembly with respect to the heat sink, wherein the mounting arrangements has a first portion located at a central portion of the mounting side and a second portion located at a central portion of the heat sink, the fan assembly comprising a fan and a fan holder having a periphery portion surrounding the first portion of the mounting arrangements and sandwiched between the fan and the heat sink, the first portion being inserted into the second portion and fixedly connected therewith.

13. The radiator of claim 12, wherein the second portion of the mounting arrangements is a cavity formed in the second side of the heat sink, and the first portion of the mounting arrangements is a central hub formed at the central portion of the mounting side, the central hub being fixedly received in the cavity.

14. The radiator of claim 13, wherein the heat sink comprises a substantially cylindrical heat absorbing portion having a first end for contacting the heat source, and an opposite second end, the cavity being defined in the second end of the heat absorbing portion, the heat sink further comprises a plurality of fins formed around the heat absorbing portion for dissipating heat of the heat absorbing portion, and the fan comprises a plurality of rotor blades rotatable to generate airflows through the fins from the second side toward the first side of the heat sink.

15. The radiator of claim 14, wherein the heat absorbing portion comprises a column defining an axial channel therein, and a heat-conductive pillar received in the axial channel, the channel being longer than the pillar, the cavity being defined in the channel.

16. The radiator of claim 7, wherein the stator blades spread from the hub in a direction opposing to rotor blades of the fan to prevent the airflow from escaping out of the heat sink too early.

17. The radiator of claim 12, wherein the fan holder comprises a plurality of stator blades extending from a periphery of the first portion of the mounting arrangements toward the periphery portion of the fan holder for guiding airflow front the fan into the heat sink.

18. The radiator of claim 12, wherein the periphery portion of the fan holder is disposed outside the heat sink and is sandwiched between the fan and a periphery portion of the heat sink.

* * * * *